United States Patent
Chen et al.

(10) Patent No.: US 11,936,299 B2
(45) Date of Patent: *Mar. 19, 2024

(54) TRANSISTOR HAVING ASYMMETRIC THRESHOLD VOLTAGE AND BUCK CONVERTER

(71) Applicant: TAIWAN SEMICONDUCTOR MANUFACTURING COMPANY, LTD., Hsinchu (TW)

(72) Inventors: Chu Fu Chen, Zhubei (TW); Chi-Feng Huang, Zhubei (TW); Chia-Chung Chen, Keelung (TW); Chin-Lung Chen, Zhubei (TW); Victor Chiang Liang, Hsinchu (TW); Chia-Cheng Pao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 744 days.

This patent is subject to a terminal disclaimer.

(21) Appl. No.: 17/027,032

(22) Filed: Sep. 21, 2020

(65) Prior Publication Data

US 2021/0028309 A1 Jan. 28, 2021

Related U.S. Application Data

(63) Continuation of application No. 15/938,482, filed on Mar. 28, 2018, now Pat. No. 10,784,781.
(Continued)

(51) Int. Cl.
*H02M 3/158* (2006.01)
*H01L 21/84* (2006.01)
(Continued)

(52) U.S. Cl.
CPC .......... *H02M 3/1582* (2013.01); *H01L 21/84* (2013.01); *H01L 29/0847* (2013.01);
(Continued)

(58) Field of Classification Search
None
See application file for complete search history.

(56) References Cited

U.S. PATENT DOCUMENTS 5,396,098 A  3/1995 Kim
5,595,919 A * 1/1997 Pan .................. H01L 21/823418
257/E21.619
(Continued)

OTHER PUBLICATIONS

Omura, Yasuhisa, "Phenomenalistic Reconsideration of Hooge Parameter in Buried-Channel Metal-Oxide_Semiconductor Field-Effect Transistors", 2001 International SOI Conference, Oct. 1, 2001, pp. 51-52.

*Primary Examiner* — Ali Naraghi
(74) *Attorney, Agent, or Firm* — Hauptman Ham, LLP

(57) ABSTRACT

A transistor includes a gate structure over a substrate, wherein the substrate includes a channel region. The transistor further includes a source/drain (S/D) in the substrate adjacent to the gate structure. The transistor further includes a lightly doped drain (LDD) region adjacent to the S/D, wherein a dopant concentration in the first LDD is less than a dopant concentration in the S/D. The transistor further includes a doping extension region adjacent the LDD region, wherein the doping extension region extends farther under the gate structure than the LDD region, and a maximum depth of the doping extension region is 10-times to 30-times greater than a maximum depth of the LDD.

20 Claims, 5 Drawing Sheets

Related U.S. Application Data

(60) Provisional application No. 62/591,871, filed on Nov. 29, 2017.

(51) Int. Cl.
*H01L 29/08* (2006.01)
*H01L 29/423* (2006.01)
*H01L 29/66* (2006.01)
*H01L 29/78* (2006.01)
*H01L 29/80* (2006.01)
*H01L 21/265* (2006.01)

(52) U.S. Cl.
CPC .... *H01L 29/4232* (2013.01); *H01L 29/66659* (2013.01); *H01L 29/7835* (2013.01); *H01L 29/7836* (2013.01); *H01L 29/80* (2013.01); *H01L 21/26586* (2013.01); *H02M 3/158* (2013.01)

(56) References Cited

U.S. PATENT DOCUMENTS

| | | | |
|---|---|---|---|
| 6,274,906 B1 | 8/2001 | Kim | |
| 7,064,039 B2 * | 6/2006 | Liu | H01L 29/6656 257/E21.345 |
| 7,157,779 B2 | 1/2007 | Nishibe | |
| 7,749,851 B2 * | 7/2010 | Katsumata | H01L 21/266 438/525 |
| 7,910,413 B2 | 3/2011 | Zhu | |
| 8,039,375 B2 * | 10/2011 | Nieh | H01L 21/26586 438/518 |
| 9,793,278 B1 * | 10/2017 | Ho | H01L 29/7835 |
| 2002/0151145 A1 * | 10/2002 | Lee | H01L 21/32137 438/303 |
| 2004/0072395 A1 * | 4/2004 | Liu | H01L 29/1083 257/E21.345 |
| 2004/0201063 A1 * | 10/2004 | Fukuda | H01L 29/78621 438/149 |
| 2006/0197129 A1 | 9/2006 | Wohlmuth | |
| 2007/0029608 A1 * | 2/2007 | Huang | H01L 21/823814 438/301 |
| 2007/0032007 A1 * | 2/2007 | Hirase | H01L 29/4983 257/E29.152 |
| 2007/0287274 A1 * | 12/2007 | Nandakumar | H01L 21/2658 438/514 |
| 2009/0090980 A1 | 4/2009 | King | |
| 2009/0140351 A1 * | 6/2009 | Lin | H01L 29/6659 257/407 |
| 2011/0070725 A1 * | 3/2011 | Power | H10B 41/30 257/E21.645 |
| 2011/0111571 A1 * | 5/2011 | Tsai | H01L 21/26506 438/305 |
| 2012/0217467 A1 | 8/2012 | Tan et al. | |
| 2018/0219533 A1 | 8/2018 | Khayat | |

\* cited by examiner

TRANSISTOR HAVING ASYMMETRIC THRESHOLD VOLTAGE AND BUCK CONVERTER

PRIORITY CLAIM

This application is a continuation of U.S. application Ser. No. 15/938,482, filed Mar. 28, 2018, now U.S. Pat. No. 10,784,781, issued on Sep. 22, 2020, which claims the priority of U.S. Provisional Application No. 62/591,871, filed Nov. 29, 2017, the entire contents of which are incorporated herein by reference.

BACKGROUND

Buck converters are used as direct current (DC) to DC power converters. Buck converters use transistors to control a current across an inductor in order to provide a reduced output power in comparison with an input power. In some instances, buck converters include transistors connected between voltages, such as a supply voltage and a reference voltage, and an inductor. During dead periods, e.g., periods of time when current is not flowing from the transistors to the inductor, the inductor causes a voltage drop at a terminal of the transistors in response to an attempt to maintain a current passing through the inductor.

In a transistor connected between the inductor and a reference voltage, such as ground, the drop in voltage at the terminal connected to the inductor causes current to flow through a body diode of the transistor. Current flowing through the body diode impacts surrounding devices in an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
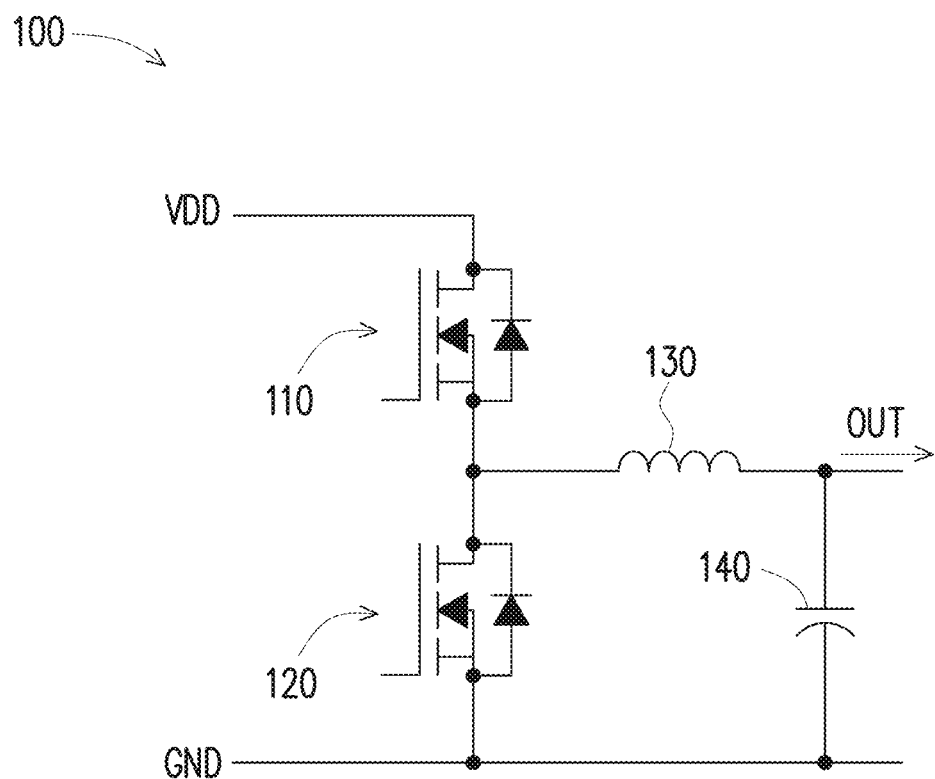
FIG. 1 is a schematic diagram of a buck converter including a transistor having an asymmetric threshold voltage in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Buck converters are commonly used in order to reduce power from an initial power supply to a lower power level for use by functional circuits within an integrated circuit (IC). For example, in some instances, buck converters are used to reduce power supplied from a battery to a lower voltage usable by a memory circuit in a device such as a mobile phone, a laptop, or other devices, e.g., devices associated with the internet of things (IoT).

A transistor connected between an inductor of a buck converter and a reference voltage, such as a ground voltage, experience a drop in voltage at the terminal of the transistor connected to the inductor during a dead period. A dead period is a period of time when a current from the terminal of the transistor to the inductor is reduced or turned off. The drop in the voltage at the terminal is the result of the inductor attempting to maintain a current passing across the inductor. This reduction in voltage at the terminal of the transistor causes a current to flow in an opposite (backward) direction across the transistor in comparison with a forward current flow direction during normal operation of the buck converter.

A portion of the current flow in the opposite direction across the transistor passes through a channel of the transistor. Another portion of the current flows in the opposite direction passes through a body diode formed in the transistor by a NPN or PNP junction through the body of the transistor. In some embodiments, a portion of the current flows through a bipolar transistor (BJT), e.g., lateral BJT (LBJT), formed by the source/drain regions of the transistor and a body of the transistor. In some embodiments, the BJT is a parasitic BJT. As a threshold voltage of the transistor for controlling the current flow in the opposite direction increases, the amount of current passing through the body diode increases. Increasing current through the body diode increases a risk of interference with neighboring devices of the integrated circuit (IC). As a result, spacing between the devices of the IC is increased, to help ensure proper functioning of the devices. However, lowering an overall threshold voltage of the transistor for current in both the forward and opposite directions of the transistor increases conducting current in the forward direction, which is contrary to a purpose of a design of a buck converter. An increased risk of undesired activation of the transistor reduces the ability of the buck converter to precisely control supply of power to a device connected downstream of the buck converter.

By using a transistor with an asymmetric threshold voltage, i.e., a threshold voltage that is different between the forward direction and the backward direction, a high threshold voltage in the forward direction helps to avoid unintentional activation of the transistor. In addition, a low threshold voltage in the reverse direction minimizes the amount of current flowing through the body diode of the transistor during dead periods. As a result, the buck converter is able to function as intended while also permitting devices of the IC to be spaced closer together with an acceptable risk of interference with neighboring devices resulting from current through the body diode of the transistor.

The asymmetric threshold voltage is formed by adding a doping extension region into the substrate adjacent to one of the source/drain regions of the transistor. The doping extension region extends to a greater depth than a lightly doped drain (LDD) region; and extends farther under the gate structure of the transistor than the LDD region. The doping extension region helps to provide a conductive path for the current flow in the opposite direction, while minimizing reduction of the threshold voltage for current flow in the forward direction.

FIG. 1 is a schematic diagram of a buck converter 100 including a transistor 120 having an asymmetric threshold voltage in accordance with some embodiments. Buck converter 100 includes a first transistor 110 connected to a supply voltage VDD. Buck converter 100 includes a second transistor 120 connected to a reference voltage GND. Second transistor 120 has an asymmetric threshold voltage. A terminal of first transistor 110 is connected to a terminal of second transistor 120 and to a first side of an inductor 130. A second side of inductor 130 is connected to an output node OUT. A capacitor 140 is connected between output node OUT and reference voltage GND. A threshold voltage for a current flowing from reference voltage GND toward inductor 130 is lower than a threshold voltage for a current flowing from inductor 130 toward reference voltage GND.

First transistor 110 is configured to selectively connect inductor 130 to supply voltage VDD. In some embodiments, first transistor 110 is a single transistor. In some embodiments, first transistor 110 includes multiple transistors connected in series. In some embodiments, first transistor 110 is a metal oxide semiconductor (MOS) transistor. In some embodiments, first transistor 110 is a p-type MOS (PMOS) transistor. In some embodiments, first transistor 110 is an n-type MOS (NMOS) transistor. In some embodiments, a terminal of first transistor 110 connected to supply voltage VDD is a source terminal. In some embodiments, the terminal of first transistor 110 connected to supply voltage VDD is a drain terminal. In some embodiments, first transistor 110 has a symmetric threshold voltage. In some embodiments, first transistor 110 has an asymmetric threshold voltage.

Second transistor 120 is configured to selectively connect inductor 130 to reference voltage GND. Second transistor 120 has an asymmetric threshold voltage such that a threshold voltage for current flowing in a first direction is different from a threshold voltage for current flowing in a second, opposite, direction.

In some embodiments, second transistor 120 is a single transistor. In some embodiments, second transistor 120 includes multiple transistors connected in series. In some embodiments where second transistor 120 includes multiple transistors, all transistors have an asymmetric threshold voltage.

In some embodiments, second transistor 120 is a MOS transistor. In some embodiments, second transistor 120 is a PMOS transistor. In some embodiments, second transistor 120 is an NMOS transistor. In some embodiments, second transistor 120 is a same type of transistor as first transistor 110. In some embodiments, second transistor 120 is a different type of transistor from first transistor 110. In some embodiments, a terminal of second transistor 120 connected to reference voltage GND is a source terminal. In some embodiments, the terminal of second transistor 120 connected to reference voltage GND is a drain terminal. In some embodiments, a BJT is formed by source/drain regions of second transistor 120 and the body of second transistor 120. In some embodiments, the BJT is a LBJT. In some embodiments, a drain of second transistor 120 is an emitter of the BJT. In some embodiments, a source of second transistor 120 is a collector of the BJT. In some embodiments, the body of second transistor 120 is a base of the BJT. In some embodiments, the BJT provides a second current path, different from a channel of second transistor 120, during an electrostatic discharge (ESD) event.

Inductor 130 is connected to both first transistor 110 and second transistor 120. Inductor 130 is configured to output a voltage and current to output node OUT based on conductivity states of first transistor 110 and second transistor 120. Inductor 130 is configured to store energy while connected to supply voltage VDD through first transistor 110; and to release stored energy to output node OUT when disconnected from supply voltage VDD. Inductor 130 also helps to reduce a peak current at output node OUT.

When both first transistor 110 and second transistor 120 are in a non-conductive state, buck converter 100 is in a dead period. During a dead period, inductor 130 resists changes in current across inductor 130. As a result, a voltage at a terminal of second transistor 120 connected to inductor 130 drops below reference voltage GND in some instances. This voltage difference results in a current across second transistor 120, in some instances.

The current across second transistor 120 passes through one of two paths. A first path is along a channel of second transistor 120. A second path is from the terminal of second transistor 120 connected to reference voltage GND through a body of the second transistor to the terminal of the second transistor 120 connected to inductor 130. In some embodiments, the second path is through a BJT formed by the source/drain regions of second transistor 120 and the body of second transistor 120. As an amount of current along the second path increases, interference with the functionality of neighboring devices increases. In order to mitigate the impact on neighboring devices in a buck converter lacking asymmetric threshold voltage transistors, spacing between devices of an IC would be increased. However, the asymmetric threshold voltage of second transistor 120 helps to permit a higher portion of the current to pass along the first path. As a result, the spacing between neighboring devices of an IC including buck converter 100 is reduced in comparison with ICs including other buck converters, in some instances.

In addition, by raising the voltage at the terminal of second transistor 120 connected to inductor 130 during the dead period, efficiency of buck converter 100 is also increased. The increased efficiency is caused by a reduced amount of time to raise the voltage connected to the first side of inductor 130 following activation of first transistor 110, i.e., connecting inductor 130 to supply voltage VDD. The reduced time for raising the voltage permits buck converter 100 to reduce power consumption in comparison with other buck converters because first transistor 110 is conductive for a shorter period of time.

Capacitor 140 is connected to output node OUT and helps to reduce ripple current from inductor 130. Ripple current is an undesired periodic variation in the current output by inductor 130. Capacitor 140 also helps to avoid voltage overshoot at output node OUT. Voltage overshoot occurs when an output voltage is above a desired output voltage. In some embodiments, capacitor 140 is a metal-insulator-metal (MIM) capacitor. In some embodiments, capacitor 140 is a polarized capacitor.

In some embodiments, supply voltage VDD is 5 volts (V). In some embodiments, supply voltage VDD is more or less than 5V. In some embodiments, reference voltage GND is 0V. In some embodiments, reference voltage GND is more or less than 0V.

Figure 2:
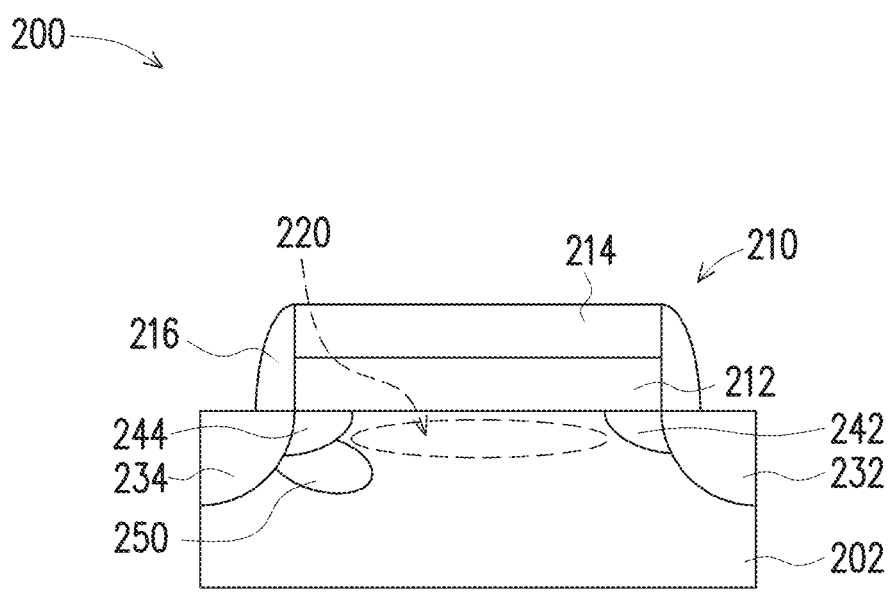
FIG. 2 is a cross-sectional view of a transistor having an asymmetric threshold voltage in accordance with some embodiments.

FIG. 2 is a cross-sectional view of a transistor 200 having an asymmetric threshold voltage in accordance with some embodiments. Transistor 200 includes a gate structure 210 over a substrate 202. Gate structure 210 includes a gate dielectric 212, a gate electrode 214 over the gate dielectric 212, and spacers 216 along sidewalls of gate dielectric 212 and gate electrode 214. A channel region 220 is in substrate 202 below gate structure 210. A first source/drain (S/D) region 232 is in substrate 202 adjacent to gate structure 210. A second S/D region 234 is in substrate 202 on an opposite side of gate structure 210 from first S/D region 232. A first lightly doped drain (LDD) region 242 is in substrate 202 and is connected with first S/D region 232 and extends closer to channel region 220. A second LDD region 244 is in substrate 202 and is connected to second S/D region 234 and extends closer to channel region 220. A doping extension region 250 is in substrate 202 and is connected to second S/D region 234 and to second LDD region 244. Doping extension region 250 is below second LDD region 244 and extends farther under gate structure 210 than the second LDD region 244.

In some embodiments, substrate 202 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, substrate 202 is doped with a first type of dopant, i.e., a p-type dopant or an n-type dopant.

Gate dielectric 212 is over substrate 202. Gate dielectric 212 is configured to provide electrical insulation between gate electrode 214 and substrate 202. In some embodiments, gate dielectric 212 is formed by a thermal oxidation, nitridation, sputter deposition, chemical vapor deposition (CVD), a combination thereof, or another suitable formation process. In some embodiments, gate dielectric 212 includes silicon oxide, silicon nitride, nitrided silicon oxide, silicon oxynitride, and high-K (for example, a K>8) dielectrics. The high-K dielectrics include metal oxides, metal silicates, metal nitrides, transition metal-oxides, transition metal silicates, metal aluminates, and transition metal nitrides, or combinations thereof. For example, in some embodiments, the high-K dielectrics include, but are not limited to, one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. In some embodiments, an etching process is used to define a shape of gate dielectric 212.

Gate electrode 214 is configured to receive an electrical signal for controlling a conductivity of channel region 220. Gate electrode 214 includes a conductive material such as polysilicon, metal, or another suitable material. In some embodiments, gate electrode 214 is formed by a deposition process, such as CVD, physical vapor deposition (PVD), plating, or another suitable deposition process. In some embodiments, an etching process is used to define a shape of gate electrode 214.

Spacers 216 help to provide electrical isolation for gate electrode 214. Spacers 216 include dielectric material. In some embodiments, spacers 216 include a single dielectric material. In some embodiments, spacers 216 include multiple dielectric materials. In some embodiments, spacers 216 include a multi-layer oxide-nitride-oxide (ONO) structure, where the spacers 216 each have a layer of silicon nitride between layers of silicon oxide. In some embodiments, spacers 216 are formed by a deposition process, such as CVD, PVD, or another suitable deposition process. In some embodiments, an etching process is used to define a shape of spacers 216. In some embodiments, spacers 216 are formed using a series of deposition processes and etching processes.

First S/D region 232 and second S/D region 234 are areas of higher charge mobility within substrate 202. A top surface of each of first S/D region 232 and second S/D region 234 is coplanar with a top surface of substrate 202. First S/D region 232 and second S/D region 234 have a second dopant type opposite the first dopant type of substrate 202. In some embodiments, first S/D region 232 is a source region and second S/D region 234 is a drain region. In some embodiments, first S/D region 232 is a drain region and second S/D region 234 is a source region.

In some embodiments, first S/D region 232 and second S/D region 234 have higher hole mobility than substrate 202. In some embodiments, first S/D region 232 and second S/D region 234 have higher electron mobility than substrate 202. In some embodiments, first S/D region 232 and second S/D region 234 include various doping configurations depending on design requirements. In some embodiments, first S/D region 232 and second S/D region 234 are doped with p-type or n-type dopants. For example, first S/D region 232 and second S/D region 234 are doped with p-type dopants, such as boron or $BF_2$; n-type dopants, such as phosphorus or arsenic; and/or combinations thereof. In some embodiments, first S/D region 232 and second S/D region 234 are configured for an NMOS transistor or for a PMOS transistor.

First S/D region 232 and second S/D region 234 are both formed by implantation processes. Ions are implanted into substrate 202. The implantation process occurs at an energy ranging from about 10 kilo electron volts (KeV) to about 150 KeV, at a dose ranging from about $1\times10^{14}$ ions/cm$^2$ to about $1\times10^{16}$ ions/cm$^2$. In some embodiments, the implantation process is a vertical implantation process. In some embodiments, the implantation process is a tilted implantation process.

In some embodiments, first S/D region 232 and second S/D region 234 are formed simultaneously. In some embodiments, first S/D region 232 and second S/D region 234 are formed sequentially. In some embodiments, a species of dopant used to form first S/D region 232 is a same species as that used to form second S/D region 234. In some embodiments, a species of dopant used to form first S/D region 232 is a different species as that used to form second S/D region 234.

In some embodiments, an anneal process follows the ion implantation process. In some embodiments, to minimize significant diffusion of dopants, such as boron, arsenic, phosphorus, etc., the peak anneal temperature should be equal to or less than about 1010° C. for rapid thermal anneal (RTA). In some embodiments, the peak anneal temperature is equal to or less than about 900° C. The duration of such RTA, or rapid thermal processing (RTP) anneal, is affected by the anneal temperature. For a higher anneal temperature, the anneal time is kept lower. In some embodiments, the RTA duration is equal to or less than about 60 seconds. For example, the anneal process is performed at a temperature in a range from about 750° C. to about 850° C. for a duration in a range from about 5 seconds to about 60 seconds, in accordance with some embodiments. If millisecond anneal (or flash anneal) is used, the peak anneal temperature is higher than the RTA temperature and the duration is reduced. In some embodiments, the peak anneal temperature is equal to or less than about 1250° C. The duration of the millisecond anneal is equal to or less than about 40 milliseconds, in accordance with some embodiments.

In some embodiments, the anneal process is performed immediately following the implantation process. In some embodiments, at least one additional process for forming transistor 200 occurs between the implantation process and the anneal process.

First LDD region 242 and second LDD region 244 have a higher dopant concentration than substrate 202, but a lower dopant concentration than first S/D region 232 and second S/D region 234. First LDD region 242 and second LDD region 244 are in a portion of substrate 202 closer to channel region 220 than first S/D region 232 and second S/D region 234. First LDD region 242 and second LDD region 244 have a same dopant type as first S/D region 232 and second S/D region 234.

First LDD region 242 and second LDD region 244 are both formed by implantation processes. The implantation process occurs at an energy ranging from about 10 KeV to 150 KeV, at a dose ranging from about $1\times10^{13}$ ions/cm$^2$ to about $8\times10^{14}$ ions/cm$^2$. The implantation process is a tilted implantation process. In some embodiments, an angle of the tilted implantation process ranges from about 15-degrees to about 30-degrees. In some embodiments, an angle for the tilted implantation process for first LDD region 242 is a same angle as that use for forming second LDD region 244. In some embodiments, the angle for the tilted implantation process for first LDD region 242 is different from an angle used for forming second LDD region 244.

In some embodiments, first LDD region 242 and second LDD region 244 are formed simultaneously. In some embodiments, first LDD region 242 and second LDD region 244 are formed sequentially. In some embodiments, a species of dopant used to form first LDD region 242 is a same species as that used to form second LDD region 244. In some embodiments, a species of dopant used to form first LDD region 242 is a different species as that used to form second LDD region 244.

In some embodiments, an anneal process follows the ion implantation process. In some embodiments, the anneal process for activating ions for first LDD region 242 and second LDD region 244 is a same anneal process as that used to activate ions for first S/D region 232 and second S/D region 234. In some embodiments, the anneal process for activating ions for first LDD region 242 and second LDD region 244 is different from the anneal process used to activate ions for first S/D region 232 and second S/D region 234.

In some embodiments, the anneal process is performed immediately following the implantation process. In some embodiments, at least one additional process for forming transistor 200 occurs between the implantation process and the anneal process.

Doping extension region 250 has a higher dopant concentration than substrate 202, but a lower dopant concentration than first LDD region 242 and second LDD region 244. Doping extension region 250 is in a portion of substrate 202 closer to channel region 220 than first LDD region 242 and second LDD region 244. Doping extension region 250 extends to a greater depth than second LDD region 244. Doping extension region 250 directly contacts both second LDD region 244 and second S/D region 234. In some embodiments, doping extension region 250 is physically separated from at least one of second LDD region 244 or second S/D region 234. Doping extension region 250 has a same dopant type as first S/D region 232 and second S/D region 234.

Doping extension region 250 is formed by an implantation process. The implantation process occurs at an energy ranging from about 100 KeV to 200 KeV, at a dose ranging from about $1\times10^{12}$ ions/cm$^2$ to about $5\times10^{13}$ ions/cm$^2$. In some embodiments, a ratio of a dopant concentration of doping extension region 250 to a doping concentration of second LDD region 244 ranges from about 1/200 to about 1/50. In some embodiments, a maximum depth of doping extension region 250 is 10-times to 30-times greater than a maximum depth of second LDD region 244.

The implantation process is a tilted implantation process. In some embodiments, an angle of the tilted implantation process ranges from about 15-degrees to about 30-degrees. In some embodiments, an angle for the tilted implantation process for second LDD region 244 is a same angle as that used for forming doping extension region 250. In some embodiments, the angle for the tilted implantation process for second LDD region 244 is different from an angle used for forming doping extension region 250.

Second LDD region 244 and doping extension region 250 are formed sequentially. In some embodiments, second LDD region 244 and doping extension region 250 are formed using a same implantation mask. In some embodiments, second LDD region 244 and doping extension region 250 are formed using different implantation masks. In some embodiments, a species of dopant used to form second LDD region 244 is a same species as that used to form doping extension region 250. In some embodiments, a species of dopant used to form second LDD region 244 is a different species as that used to form doping extension region 250.

In some embodiments, an anneal process follows the ion implantation process. In some embodiments, the anneal process for activating ions for doping extension region 250 is a same anneal process as that used to active ions for first LDD region 242 and second LDD region 244. In some embodiments, the anneal process for activating ions for doping extension region 250 is different from the anneal process used to activate ions for first LDD region 242 and second LDD region 244.

In some embodiments, the anneal process is performed immediately following the implantation process. In some embodiments, at least one additional process for forming transistor 200 occurs between the implantation process and the anneal process.

By including doping extension region 250 in transistor 200, a conductive path provided along channel region 220 for current flowing from second S/D region 234 to first S/D region 232 has a lower threshold voltage in comparison with transistors which do not include doping extension region 250. By increasing the amount of current flowing along channel region 220 in comparison with current flowing through a body of transistor 200, interference with surrounding devices is reduced and a risk of forming a conductive path through the body of transistor 200 which negatively impacts performance of transistor 200 is reduced. In some instances, a power cycle is used to remove a conductive path through the body of a transistor. A power cycle involves turning the IC off and then back on. Such power cycle reduces efficiency of operation of the IC.

Figure 3:
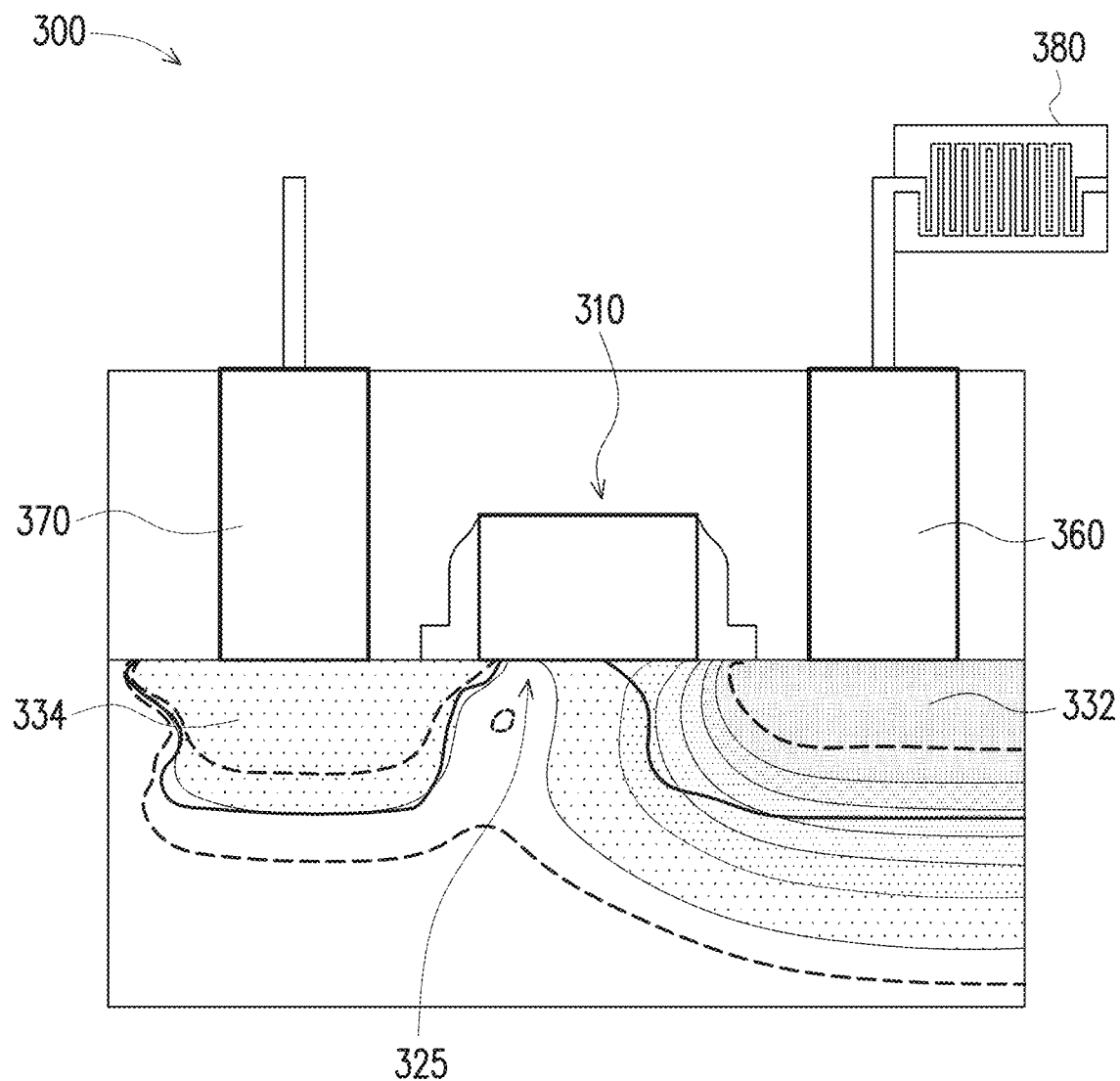
FIG. 3 is a cross-sectional view of electrical fields of a transistor during operation of the transistor having an asymmetric threshold voltage in accordance with some embodiments.

FIG. 3 is a cross-sectional view of electrical fields of a transistor 300 having an asymmetric threshold voltage during operation of the transistor in accordance with some embodiments. Transistor 300 is similar to transistor 200 and like elements have a same reference number increased by 100. In comparison with transistor 200, transistor 300 includes a first S/D contact 360 electrically connected to first S/D region 332. Transistor 300 also includes a second S/D contact 370 electrically connected to second S/D region 334. An inductor 380 is electrically connected to first S/D contact 360. In some embodiments, inductor 380 is part of a buck converter, e.g., buck converter 100 (FIG. 1).

In the operation of transistor 300, a voltage value at first S/D contact 360 is higher than a voltage value at second S/D contact 370. In operation, transistor 300 includes a low conductivity area 325, which is located within a channel region of transistor 300. The channel region of transistor 300 is not labeled in FIG. 3 for the sake of clarity. Low conductivity area 325 is an indication of a high threshold voltage for transistor 300 when the voltage at first S/D contact 360 is greater than the voltage at second S/D contact 370. In some embodiments, in operation, the voltage at first S/D contact 360 is about 5 V; and the voltage at second S/D contact 370 is about 0V. In some embodiments, the voltages at first S/D contact 360 and second S/D contact 370 are other values.

Figure 4:
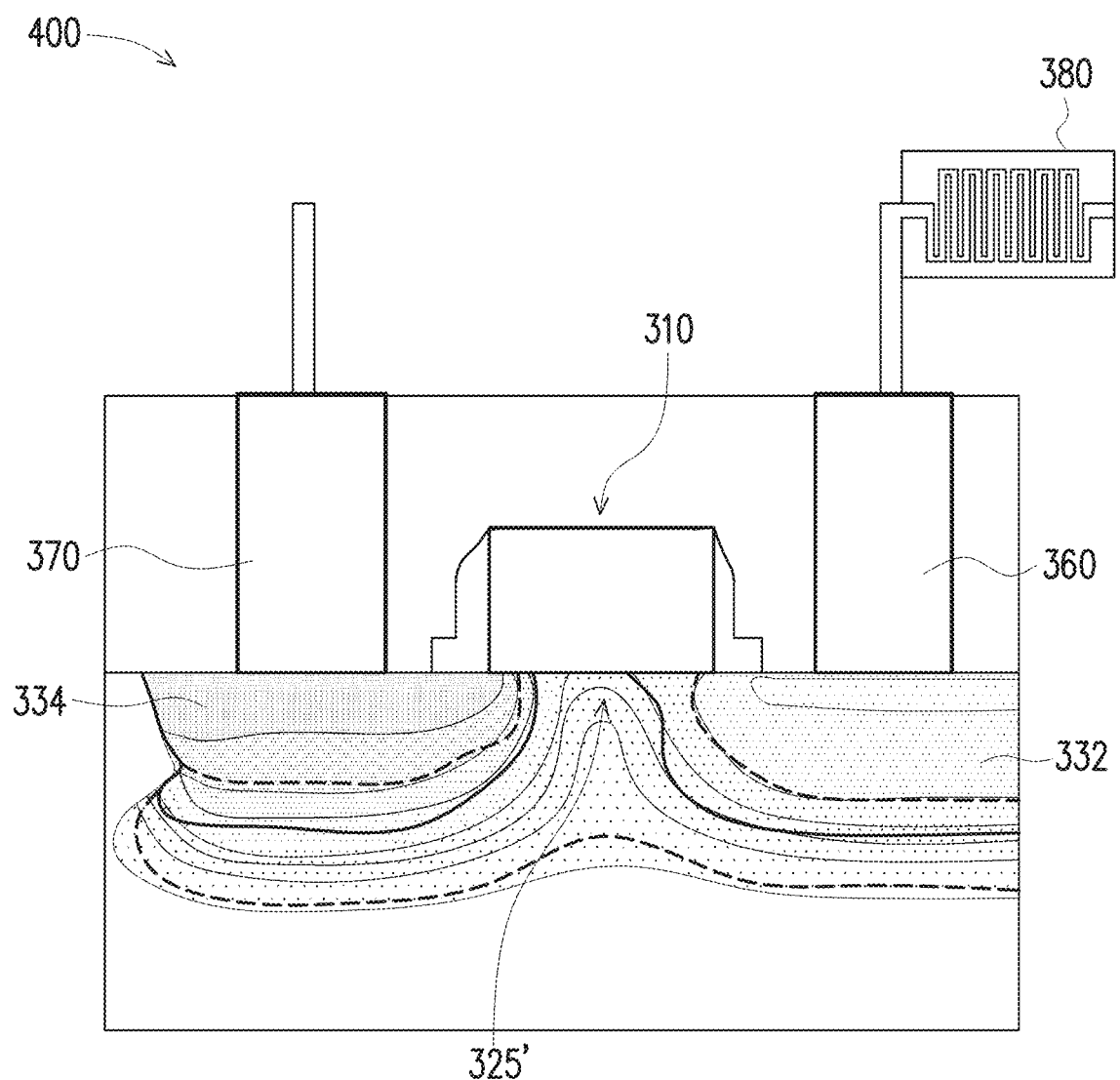
FIG. 4 is a cross-sectional view of electrical fields of a transistor during a dead period of the transistor having an asymmetric threshold voltage in accordance with some embodiments.

FIG. 4 is a cross-sectional view of electrical fields of a transistor 400 having an asymmetric threshold voltage during a dead period of the transistor in accordance with some embodiments. Transistor 400 is similar to transistor 300 and like elements have a same reference number. In comparison with transistor 300, transistor 400 has a higher voltage at second S/D contact 370 than at first S/D contact 360.

In operation, transistor 400 includes a high conductivity area 325', which is located within a channel region of transistor 400. The channel region of transistor 400 is not labeled in FIG. 4 for the sake of clarity. High conductivity area 325' is an indication of a low threshold voltage for transistor 400 when the voltage at first S/D contact 360 is less than the voltage at second S/D contact 370. In some embodiments, in operation, the voltage at first S/D contact 360 is about −0.7 V; and the voltage at second S/D contact 370 is about 0V. In some embodiments, the voltages at first S/D contact 360 and second S/D contact 370 are other values.

A comparison of transistor 300 and transistor 400 indicates that a conductivity of a channel region is asymmetric. That is, when the voltage at first S/D contact 360 is higher than the voltage at second S/D contact 370, the transistor exhibits a higher threshold voltage, i.e., lower conductivity in the channel region, in comparison with a situation where the voltage at first S/D contact 360 is less than the voltage at second S/D contact 370. This increased conductivity in the channel region when the voltage at second S/D contact 370 is higher than the voltage at first S/D contact 360 helps to maximize an amount of current flowing through the channel region and minimizing current flowing through the body of the transistor.

Figure 5:
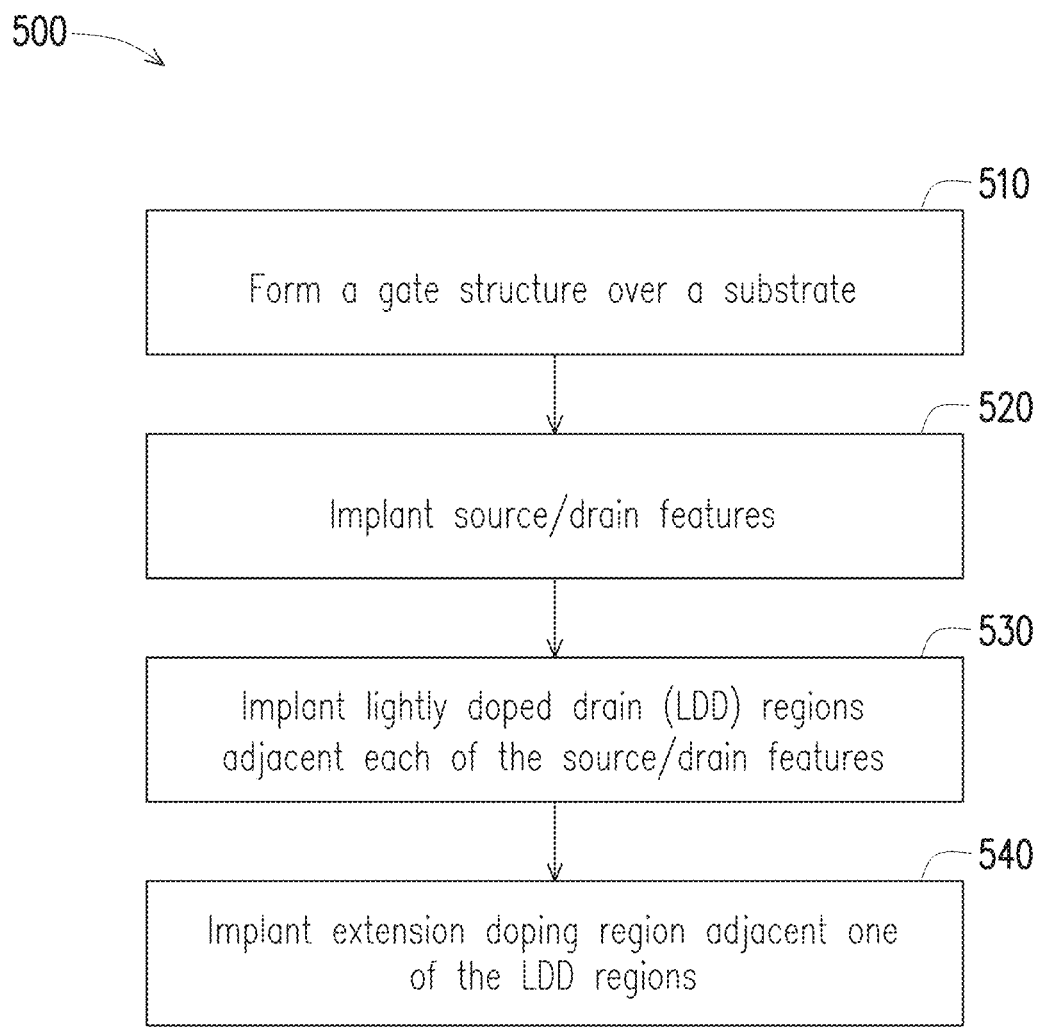
FIG. 5 is a flowchart of a method of making a transistor having an asymmetric threshold voltage in accordance with some embodiments.

FIG. 5 is a flowchart of a method 500 of making a transistor having an asymmetric threshold voltage in accordance with some embodiments. Method 500 includes operation 510 in which a gate structure is formed over a substrate. The gate structure includes a gate dielectric, a gate electrode and spacers. The gate structure is formed through a series of deposition and patterning processes. In some embodiments, the deposition processes include CVD, PVD, plating or other suitable deposition processes. In some embodiments, the patterning processes include photolithography and etching processes.

Method 500 further includes operation 520 in which source/drain features are implanted. The source/drain features are implanted into the substrate by an ion implantation process. The source/drain features have a different dopant type from the substrate. In some embodiments, the source and the drain features are implanted simultaneously. In some embodiments, the source and the drain features are implanted sequentially. In some embodiments, the source/drain features are implanted by a tilted implantation process. In some embodiments, the source/drain features are implanted by a vertical implantation process. In some embodiments, spacers of the gate structure are used as an implantation mask for implanting the source/drain features. In some embodiments, an additional implantation mask, e.g., a photoresist mask, is used to form an implantation mask for implanting the source/drain features.

Method 500 further includes operation 530 in which LDD regions are implanted adjacent to each of the source/drain features. The LDD regions are implanted into the substrate by an ion implantation process. The LDD regions have a same dopant type as the source/drain features. In some embodiments, the LDD regions have a same species of dopant as both of the source/drain features. In some embodiments, at least one of the LDD regions has a different species of dopant from at least one of the source/drain features. In some embodiments, the LDD regions are implanted simultaneously. In some embodiments, the LDD regions are implanted sequentially. The LDD regions are implanted by a tilted implantation process. In some embodiments, the angle for the tilted implantation process ranges from about 15-degrees to about 30-degrees. In some embodiments, spacers of the gate structure are used as an implantation mask for implanting the LDD regions. In some embodiments, an additional implantation mask, e.g., a photoresist mask, is used to form an implantation mask for implanting the LDD regions.

Method 500 further includes operation 540 in which a doping extension region is implanted adjacent to one of the LDD regions. The doping extension region is implanted into the substrate by an ion implantation process. The doping extension region a same dopant type as the source/drain features. In some embodiments, the LDD regions have a same species of dopant as the doping extension region. In some embodiments, at least one of the LDD regions has a different species of dopant from the doping extension region. The doping extension region is implanted by a tilted implantation process. In some embodiments, the angle for the tilted implantation process ranges from about 15-degrees to about 30-degrees. In some embodiments, an angle for implanting the doping extension region is a same angle as that used to implant at least one of the LDD regions. In some embodiments, the angle for implanting the doping extension region is different from that used to implant at least one of the LDD regions. An energy used to implant the doping extension region is greater than that used to implant the LDD regions. As a result, the doping extension region is implanted deeper into the substrate than the LDD regions. In some embodiments, spacers of the gate structure are used as an implantation mask for implanting the doping extension region. In some embodiments, an additional implantation mask, e.g., a photoresist mask, is used to form an implantation mask for implanting the doping extension region. In some embodiments, a same implantation mask is used to implant the doping extension region and one of the LDD regions. In some embodiments, a different implantation mask is used to implant the doping extension region as that used to implant the LDD regions.

In some embodiments, an order of operations of method 500 is changed. For example, in some embodiments, the source/drain features are implanted prior to forming the gate structure. In some embodiments, at least one additional operation is included in method 500. For example, in some embodiments, at least one annealing processes is added to method 500 in order to activate dopants implanted for any or all of the source/drain features, the LDD regions or the doping extension region.

An aspect of this description relates to a transistor. The transistor includes a gate structure over a substrate, wherein the substrate includes a channel region. The transistor further includes a source/drain (S/D) in the substrate adjacent to the gate structure. The transistor further includes a lightly doped drain (LDD) region adjacent to the S/D, wherein a dopant concentration in the first LDD is less than a dopant concentration in the S/D. The transistor further includes a doping extension region adjacent the LDD region, wherein the doping extension region extends farther under the gate structure than the LDD region, and a maximum depth of the doping extension region is 10-times to 30-times greater than a maximum depth of the LDD. In some embodiments, the LDD region is between the gate structure and the doping extension region. In some embodiments, the transistor further includes a second S/D in the substrate, wherein the doping extension is between the S/D and the second S/D. In some embodiments, the doping extension is below a portion of the channel region. In some embodiments, the LDD region directly contacts the gate structure. In some embodiments, the gate structure includes a gate dielectric over the substrate; and a gate electrode over the gate dielectric. In some embodiments, the gate structure further includes spacers surrounding the gate dielectric and the gate electrode. In some embodiments, the doping extension region extends underneath the gate dielectric. In some embodiments, the doping extension region directly contacts the LDD region and the S/D.

An aspect of this description relates to a buck converter. The buck converter includes a first transistor configured to receive a supply voltage. The buck converter further includes a second transistor connected to the first transistor, wherein the second transistor is configured to receive a reference voltage. The second transistor includes a gate structure over a substrate, wherein the substrate includes a channel region. The second transistor further includes a source/drain (S/D) in the substrate adjacent to the gate structure. The second transistor further includes a lightly doped drain (LDD) region adjacent to the S/D, wherein a dopant concentration in the first LDD is less than a dopant concentration in the S/D. The second transistor further includes a doping extension region adjacent the LDD region, wherein the doping extension region extends farther under the gate structure than the LDD region, and a maximum depth of the doping extension region is 10-times to 30-times greater than a maximum depth of the LDD. In some embodiments, the buck converter further includes an inductor connected to both the first transistor and the second transistor. In some embodiments, the inductor is between the second transistor and an output of the buck converter. In some embodiments, the inductor is between the first transistor and an output of the buck converter. In some embodiments, the buck converter further includes a capacitor configured to receive the reference voltage. In some embodiments, the capacitor is electrically connected in parallel with the second transistor. In some embodiments, the second transistor has an asymmetric threshold voltage. In some embodiments, the first transistor has a symmetric threshold voltage. In some embodiments, the first transistor has an asymmetric threshold voltage.

An aspect of this description relates to a transistor. The transistor includes a gate structure over a substrate. The transistor further includes a source/drain (S/D) in the substrate. The transistor further includes a lightly doped drain (LDD) region in direct contact with the S/D, wherein a dopant concentration in the first LDD is less than a dopant concentration in the S/D. The transistor further includes a doping extension region in direct contact with the LDD region, wherein a maximum depth of the doping extension region is 10-times to 30-times greater than a maximum depth of the LDD. In some embodiments, the doping extension region extends farther under the gate structure than the LDD region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A transistor comprising:
 a gate structure over a substrate, wherein the substrate includes a channel region;
 a source/drain (S/D) in the substrate adjacent to the gate structure;
 a lightly doped drain (LDD) region adjacent to the S/D, wherein a dopant concentration in the LDD region is less than a dopant concentration in the S/D; and
 a doping extension region adjacent the LDD region, wherein the doping extension region extends farther under the gate structure than the LDD region, and a maximum depth of the doping extension region is 10-times to 30-times greater than a maximum depth of the LDD.

2. The transistor of claim 1, wherein the LDD region is between the gate structure and the doping extension region.

3. The transistor of claim 1, further comprising a second S/D in the substrate, wherein the doping extension is between the S/D and the second S/D.

4. The transistor of claim 1, wherein the doping extension is below a portion of the channel region.

5. The transistor of claim 1, wherein the LDD region directly contacts the gate structure.

6. The transistor of claim 1, wherein the gate structure comprises:
   a gate dielectric over the substrate; and
   a gate electrode over the gate dielectric.

7. The transistor of claim 6, wherein the gate structure further comprises spacers surrounding the gate dielectric and the gate electrode.

8. The transistor of claim 6, wherein the doping extension region extends underneath the gate dielectric.

9. The transistor of claim 1, wherein the doping extension region directly contacts the LDD region and the S/D.

10. A buck converter comprising:
    a first transistor configured to receive a supply voltage; and
    a second transistor connected to the first transistor, wherein the second transistor is configured to receive a reference voltage, and the second transistor comprises:
      a gate structure over a substrate, wherein the substrate includes a channel region;
      a source/drain (S/D) in the substrate adjacent to the gate structure;
      a lightly doped drain (LDD) region adjacent to the S/D, wherein a dopant concentration in the LDD region is less than a dopant concentration in the S/D; and
      a doping extension region adjacent the LDD region, wherein the doping extension region extends farther under the gate structure than the LDD region, and a maximum depth of the doping extension region is 10-times to 30-times greater than a maximum depth of the LDD.

11. The buck converter of claim 10, further comprising an inductor connected to both the first transistor and the second transistor.

12. The buck converter of claim 11, wherein the inductor is between the second transistor and an output of the buck converter.

13. The buck converter of claim 11, wherein the inductor is between the first transistor and an output of the buck converter.

14. The buck converter of claim 10, further comprising a capacitor configured to receive the reference voltage.

15. The buck converter of claim 14, wherein the capacitor is electrically connected in parallel with the second transistor.

16. The buck converter of claim 10, wherein the second transistor has an asymmetric threshold voltage.

17. The buck converter of claim 10, wherein the first transistor has a symmetric threshold voltage.

18. The buck converter of claim 10, wherein the first transistor has an asymmetric threshold voltage.

19. A transistor comprising:
    a gate structure over a substrate;
    a source/drain (S/D) in the substrate;
    a lightly doped drain (LDD) region in direct contact with the S/D, wherein a dopant concentration in the LDD region is less than a dopant concentration in the S/D; and
    a doping extension region in direct contact with the LDD region, wherein a maximum depth of the doping extension region is 10-times to 30-times greater than a maximum depth of the LDD.

20. The transistor of claim 19, wherein the doping extension region extends farther under the gate structure than the LDD region.

* * * * *